United States Patent
Yoo

(10) Patent No.: US 6,340,541 B1
(45) Date of Patent: Jan. 22, 2002

(54) MASK FOR RECYCLING AND FABRICATION METHOD THEREOF

(75) Inventor: Seung Seok Yoo, Daeku (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/140,459

(22) Filed: Aug. 26, 1998

(30) Foreign Application Priority Data

Dec. 17, 1997 (KR) .......................................... 97-070071

(51) Int. Cl.[7] .................................................. G03F 9/00
(52) U.S. Cl. ............................................. 430/5; 428/14
(58) Field of Search ............................... 428/14; 430/5; 355/53, 55, 75

(56) References Cited

U.S. PATENT DOCUMENTS

| | | | | |
|---|---|---|---|---|
| 5,240,796 A | * | 8/1993 | Lee et al. ...................... | 430/5 |
| 5,394,219 A | * | 2/1995 | Hirosue ........................ | 355/77 |
| 5,397,665 A | * | 3/1995 | Tabuchi et al. ................ | 430/5 |
| 5,422,704 A | * | 6/1995 | Sego ............................ | 355/53 |
| 5,453,816 A | * | 9/1995 | Wang ........................... | 355/75 |
| 5,622,787 A | | 4/1997 | Sakata et al. ................. | 428/620 |
| 5,958,631 A | * | 9/1999 | Acosta et al. .................. | 430/5 |

* cited by examiner

Primary Examiner—Mark F. Huff
Assistant Examiner—Saleha R. Mohamedulla

(57) ABSTRACT

A recyclable mask which includes: a substrate which is optically transparent; a thin film having non-transparent-layer patterns on the substrate; a pair of mask frames placed on each marginal portion of upper and lower surface of the thin film; at least one mask frame holder fixing the mask frames and the thin film as a single body; a pellicle frame which is attached to a portion of top and bottom surfaces of each mask frame; and a pellicle attached to top and bottom surfaces of each pellicle frame and thus covering a center part of the thin film.

17 Claims, 5 Drawing Sheets

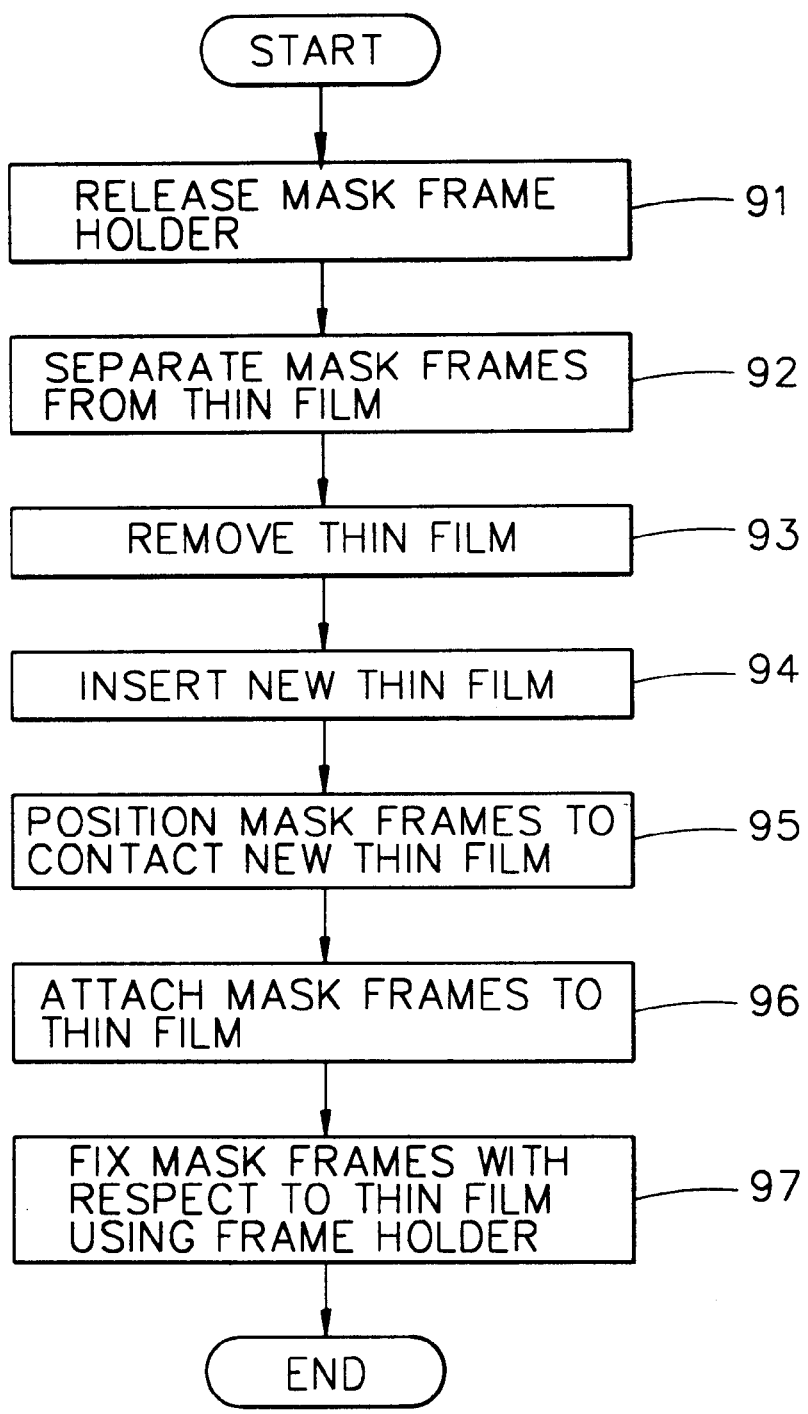

MASK FOR RECYCLING AND FABRICATION METHOD THEREOF

BACKGROUND OF THE INVENTION

1. Field of the Invention

The present invention relates to a semiconductor device, and in particular to an improved mask for recycling and a fabrication method capable of recycling the mask.

2. Description of the Conventional Art

In semiconductor device fabrication, a light exposing process for forming a pattern on a semiconductor substrate is called a photolithography process.

The photolithography process will be described hereinbelow. First, a photoresist film, which reacts to a light, is applied on a semiconductor substrate, and a mask having a pattern provided with a light transmitting unit and a non-transparent unit is formed on the semiconductor substrate. The mask is irradiated by an irradiator. Therefore, the photoresist film on the semiconductor substrate reacts to the light passing through the light transmitting unit. When the semiconductor substrate is put into a developing solution, the portion of the photoresist film that reacts to the light is removed, or the other portion of the photoresist fiber that does not react to the light is removed, a pattern being formed on the semiconductor substrate in either case.

A conventional mask applied to the photolithography process is illustrated in FIGS. 1 and 2. FIG. 2 is a vertical cross-sectional view taken along the line II–II' in FIG. 1.

A thin film 1 is provided with a plurality of non-transparent patterns 3 of a predetermined shape, positioned at a central portion of an optically transparent substrate 2 having a predetermined thickness.

A pellicle frame 6 having a predetermined height surrounds the patterns 3 of the thin film 1, a hole being formed in a central part of the pellicle frame 6. The pellicle frame 6 is attached to each marginal portion of upper and lower surfaces 1a, 1b of the substrate of the thin film 1. A pellicle 7, that is a pattern protection film, is attached to top and bottom surfaces of each pellicle frame 6 which is attached to the upper and lower surfaces 1a, 1b, respectively, of the thin film 1. Since each pellicle 7 is attached to the pellicle frame 6 by an adhesive, the pellicle 7 and the thin film 1 are fixed together and inseparable from each other. Here, the pellicle 7 protects the patterns 3 formed on the substrate 2.

A fabrication method of the conventional mask will now be described.

First, the thin film 1 is fabricated. That is, a thin layer of a material that is not optically transparent, such as chromium (Cr), is applied to a surface of the optically transparent substrate 2, which substrate is flat has a predetermined thickness, thus forming a chrome film. Next, a resist film that reacts to light or electron beams is applied on the chrome film, and the resist film is exposed to a desired pattern of light projected by a light exposing apparatus or an electron beam irradiator. The irradiated resist film is thus developed to form a resist pattern. The chrome film is etched using the resist pattern as the protection film, thereby forming the non-transparent patterns 3. As described above, the non-transparent patterns 3 of the chrome film are formed on one side 1a of the thin film 1, and the other side 1b thereof remains optical-transparent glass material.

In the photolithography process, a part of the substrate of the thin film having each non-transparent pattern 3 formed thereon does not transmit light, but other parts of the substrate of the thin film that do not have the non-transparent patterns 3 formed thereon transmit light. However, when the part of the transparent substrate 2 not having the non-transparent patterns 3 formed thereon is externally damaged or has a foreign substance thereon, a pattern which is different from the desired pattern is formed on the substrate 2 and thus by the thin film as a whole. For that reason, it is necessary to provide a protection film, that is the pellicle 7, for protecting the both sides 1a, 1b of the thin film 1.

Accordingly, the pellicle frame 6 is attached to each marginal portion of the upper and lower surfaces 1a, 1b of the thin film 1, and each pellicle 7 is attached to the pellicle frame 6 in order to cover the patterns 3. The thusly fabricated mask provided with the thin film 1, the pellicle frames 6, and the pellicles 7 can be used almost permanently.

However, when a product using the conventional mask is not manufactured, the thin film 1 of the mask becomes needless. Accordingly, although the pellicle frame 6 and the pellicle 7 for protecting the thin film 1 may be useful for protecting other objects/films, they are rendered useless since they are attached by an adhesive to the obsolete mask. Thus, because the pellicle frame 6 and the pellicle 7 are inseparable from the thin film 1, the whole mask must be disposed.

Also, although the price of the mask varies based on the manufacturing difficulty of the thin film 1, it is generally expensive for conventional devices as described above. Accordingly, disposing of the whole mask is very costly. In addition, disposing of the whole mask is environmentally wasteful.

SUMMARY OF THE INVENTION

The present invention is directed to a mask and fabrication method that substantially obviates one or more of the problems experienced due to the above and other limitations and disadvantages of the conventional art It is an object of the present invention to provide a recyclable mask and a fabrication method thereof, where the mask may be recycled by replacing only a thin film of a predetermined pattern formed in the mask, without discarding the whole mask.

Other and further objects, features and advantages of the present invention will be set forth in the description that follows, and in part will become apparent from the detailed description, or may be learned by practice of the invention.

To achieve these and other objects and advantages and in accordance with the purpose of the present invention, as embodied and broadly described, there is provided a mask for recycling which includes: a thin film having predetermined-shaped patterns; a pair of solid mask frames placed on each marginal portion of upper and lower surfaces of the thin film, and respectively having an opening in the center thereof; a plurality of mask frame holders for fixing the mask frames and the thin film as a single body; a pellicle frame which is attached to each portion of top and bottom surfaces of each mask frame; and a pellicle attached to top and bottom surfaces of each pellicle frame.

Additionally, to achieve the above and other objects and advantages, there is provided a fabrication method for a mask for recycling, including: fabricating a thin film; placing a mask frame on each portion of upper and lower surfaces of the thin film; fixing the mask frames; attaching each pellicle frame to top and bottom surfaces of the mask frames, respectively; and attaching each pellicle to top and bottom surfaces of the pellicle frames.

The fabricating step may include applying a non-transparent layer on an optical-transparent substrate, forming a resist pattern on the non-transparent layer, and etching the non-transparent layer with the resist pattern as a mask, thus forming non-transparent layer patterns.

Also, the fabricating step may include forming a resist pattern on a non-transparent substrate for intercepting light, and selectively etching and opening the non-transparent substrate with the resist pattern as a mask, thereby forming transparent patterns. In addition, the fabricating step may further include filling up substance for transmitting light in an open portion of the non-transparent substrate.

There may also be provided a mask recycling method which includes: separating mask frame holders from mask frames; removing a thin film placed between the mask frames; inserting a new thin film between the mask frames; and fixing the mask frames and the thin film with the mask frame holders.

It is to be understood that both the foregoing general description and the following detailed description are exemplary and explanatory and are intended to provide further explanation of the invention as claimed. Thus, it should be understood that the detailed description and specific examples, while indicating preferred embodiments of the invention, are given by way of example only since various changes and modifications that are within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 9 illustrates a method for recycling a mask according to the present invention.

DETAILED DESCRIPTION OF THE INVENTION

With reference to the accompanying drawings, a mask for recycling according to embodiments of the present invention will be described in detail. Here, the elements which are the same as those of the conventional art are labeled with the same reference numbers.

Figure 1:
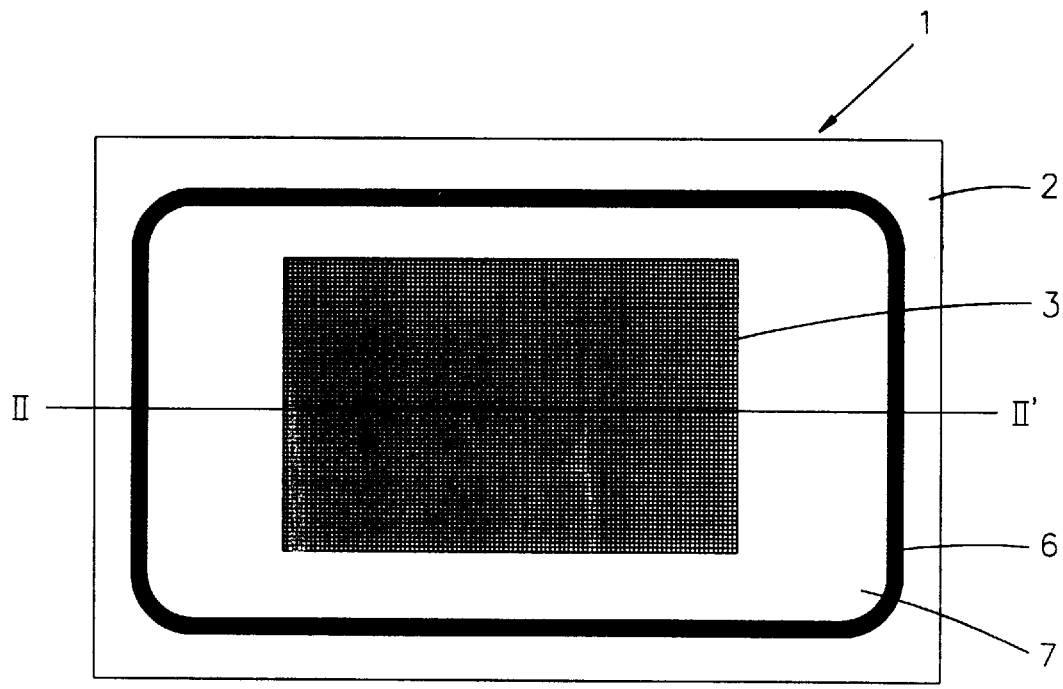
FIG. 1 is a plane diagram of a conventional mask.
Figure 2:
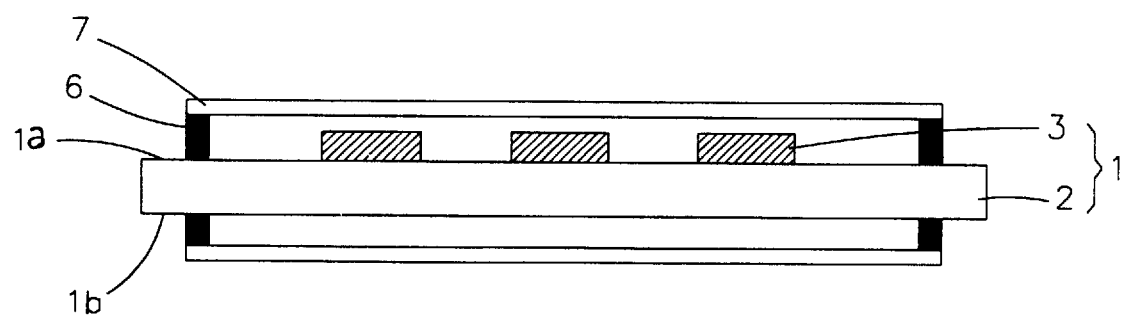
FIG. 2 is a vertical cross-sectional view of the conventional mask of FIG. 1 taken along the line II–II'.
Figure 3:
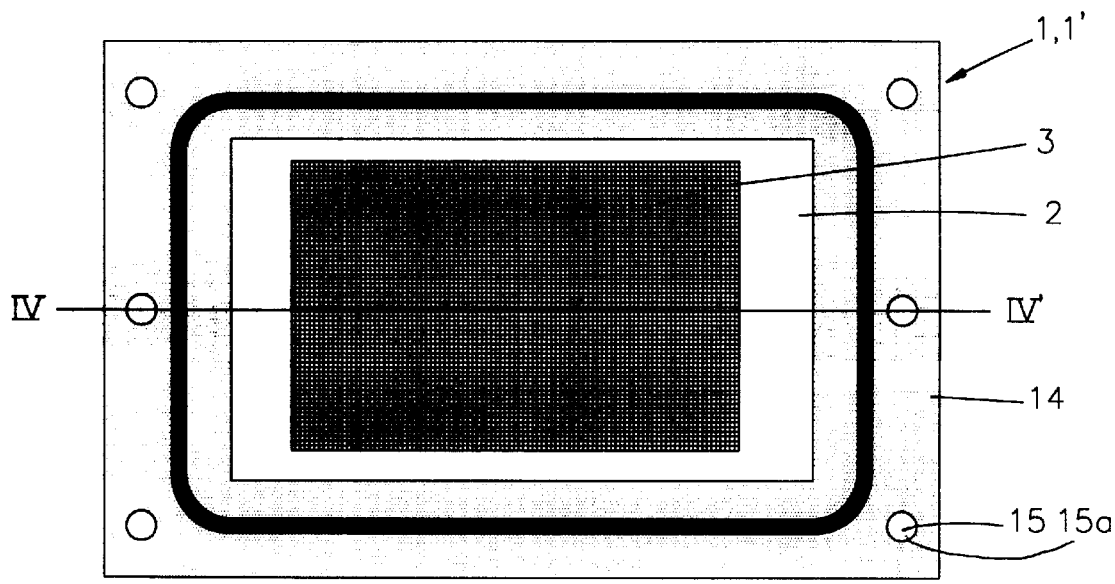
FIG. 3 is a plane diagram illustrating an example of a mask for recycling according to a first embodiment of the present invention.
Figure 4:
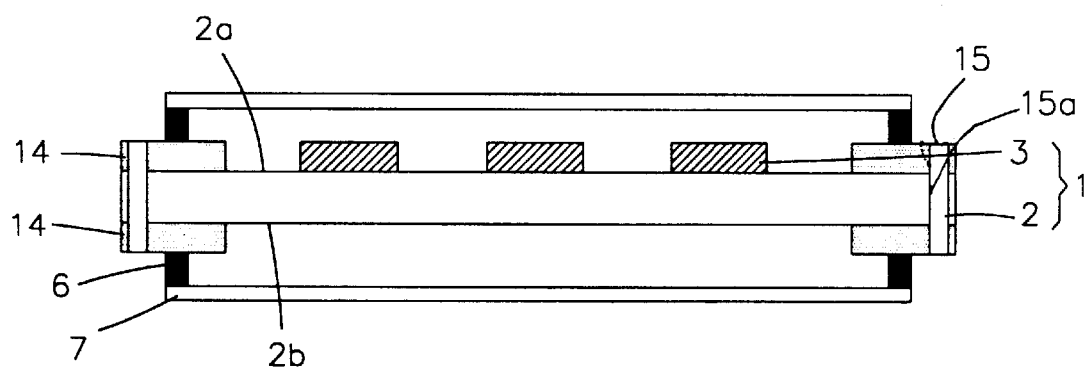
FIG. 4 is a vertical cross-sectional view illustrating an example of the mask for recycling of FIG. 3 taken along the line IV–IV'.

FIG. 3 is a plane diagram illustrating an example of the mask for recycling according to a first embodiment of the present invention, and FIG. 4 is a vertical cross-sectional view illustrating an example of the mask for recycling of FIG. 3 taken along the line IV–IV'. As shown therein, a thin film 1 is inserted between a pair of solid mask frames 14 having a predetermined thickness, and the thin film 1 and the mask frames 14 are fixed by a plurality of mask frame holders 15 as a single body. To prevent the thin film 1 from being physically or chemically damaged, a pellicle frame 6 is attached to each portion of top and bottom surfaces of the mask frames 14 by an adhesive, and a pellicle 7 is bonded to each of top and bottom surfaces of the pellicle frame 6. As the mask frame holder 15, a screw is inserted into each of a plurality of holes 15a formed through the mask frames 14, fixing the mask frames 14 and the thin film 1.

Figure 5:
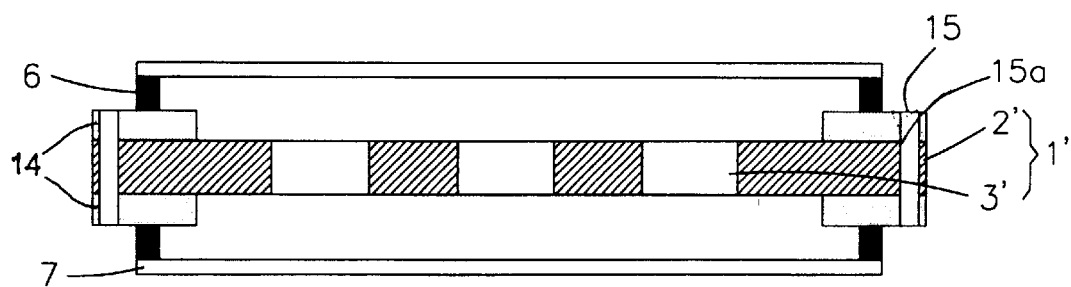
FIG. 5 is a vertical cross-sectional view wherein a thin film of the mask in FIG. 3 is modified.

The thin film may have a structure 1 in which non-transparent patterns 3 are formed on an optical-transparent substrate 2 as shown in FIG. 4, or a structure 1' in which a non-transparent substrate 2' is optically opaque with transparent patterns 3' punched therethrough as shown by the example of FIG. 5. The transparent patterns 3' may be penetrating through the non-transparent substrate 2', or may be filled with a material which is optically transparent such as glass, silicon dioxide, etc.

A fabrication method for the mask for recycling according to the first embodiment of the present invention will now be described.

First, a fabrication method for the thin film 1, as shown for example in FIG. 4, will be described.

A non-transparent material such as a chromium (Cr) is thinly applied on an upper surface of the optical-transparent substrate 2, which substrate is flattened and has a predetermined thickness, thus forming a chrome film. Next, a resist film that reacts to incident light or electron beams is applied on the chrome film, and the resist film is irradiated with light or electron beams in accordance with a desired pattern by a light exposing apparatus or an electron beam irradiator. A resist pattern is formed by developing the resist film which was irradiated with light or electron beams, and the chrome film is etched by using the resist pattern as a protection film, thus forming the non-transparent patterns 3 of the chrome film. Accordingly, on one side 1a of the thusly provided thin film 1, there are provided the non-transparent patterns 3 formed of the chrome film and having a predetermined shape, while on the other side 1b thereof the transparent-glass material remains.

In the above photolithography process, a part of the substrate of the thin film having a non-transparent pattern 3 formed thereon does not transmit light, but other parts of the transparent substrate of the thin film that do not have the non-transparent patterns 3 formed thereon transmit the light However, when the part of the transparent substrate 2 not having the non-transparent patterns 3 formed thereon is externally damaged, or has a foreign substance thereon, a pattern which is different from the desired pattern might be formed on the semiconductor substrate 2. Thus, it is necessary to protect the thin film 1.

A method for fabricating the thin film 1' as shown in FIG. 5 will be described.

First, a resist film that optically intercepts light is applied to non-transparent substrate 2', and the resist film is developed, via irradiation with light or electron beams, to form a resist pattern. With the resist pattern as a mask, the non-transparent substrate 2' is etched, thereby forming a transparent patterns 3'. The non-transparent substrate 2' may be applied without filling the open parts created by etching the non-transparent substrate 2' as it is being etched, or the transparent patterns 3' within the non-transparent substrate 2' may be formed by applying an optically transparent material to the open parts created by etching the non-transparent substrate 2'.

As described above, the thin film 1,1' is fabricated, and a plurality of holes (not shown) are formed along a marginal portion of the thin film 1,1'. Next, a pair of solid mask frames 14 each solid mask frame 14 has a hole defined in its central region so as to surround the patterns 3,3' of the thin film 1,1' and has a predetermined thickness sufficient to provide stabilizing. In addition, holes 15a are formed along each marginal portion of the mask frames 14, and the thin film 1,1' is inserted between the two mask frames 14. The holes 15a formed through the mask frames 14 correspond respectively to the holes (not shown) of the thin film 1,1'. Next, a screw is inserted into each of the holes 15a formed through the mask frames 14, which screws fix the mask frames 14 and the thin film 1,1'. Here, the screw therefore functions as a mask frame holder 15 although other holders would be readily apparent to those of ordinary skill.

To protect the thin film 1,1', the pellicle frame 6 is attached to top and bottom surfaces of the mask frames 14, respectively, by an adhesive or other devices capable of attachment, and the pellicle 7 is attached to each of top and bottom surfaces of the pellicle frames 6.

Figure 6:
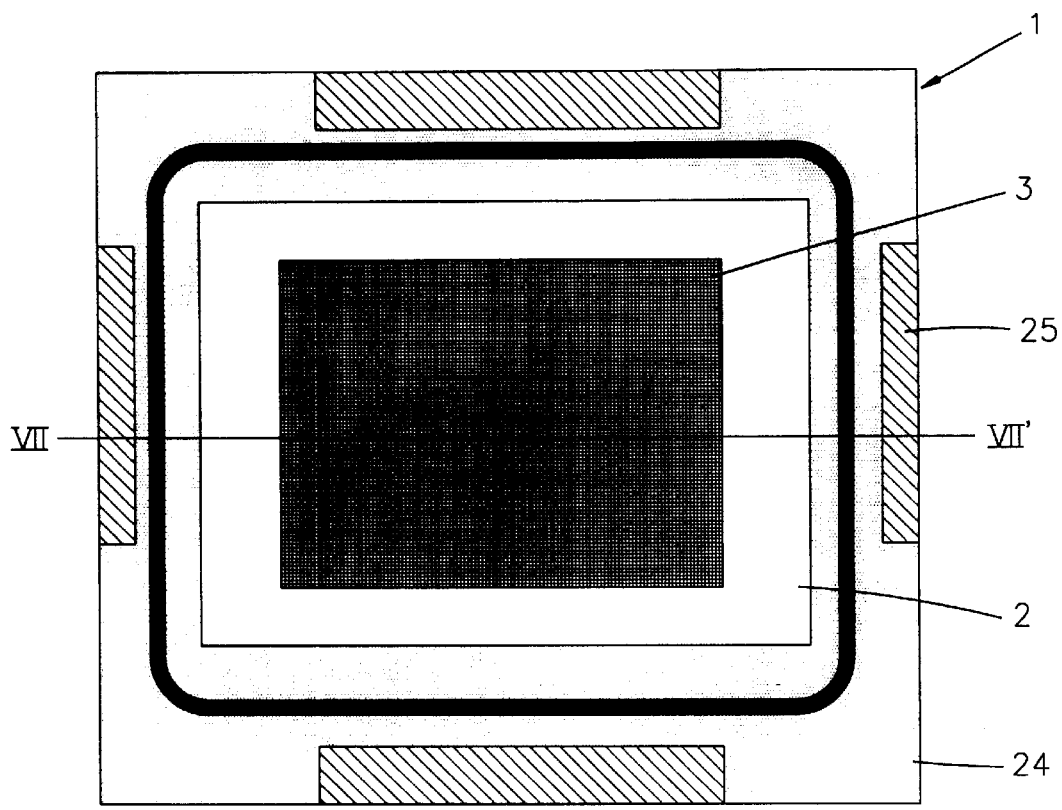
FIG. 6 is a plane diagram illustrating an example of a mask for recycling according to a second embodiment of the present invention.
Figure 7:
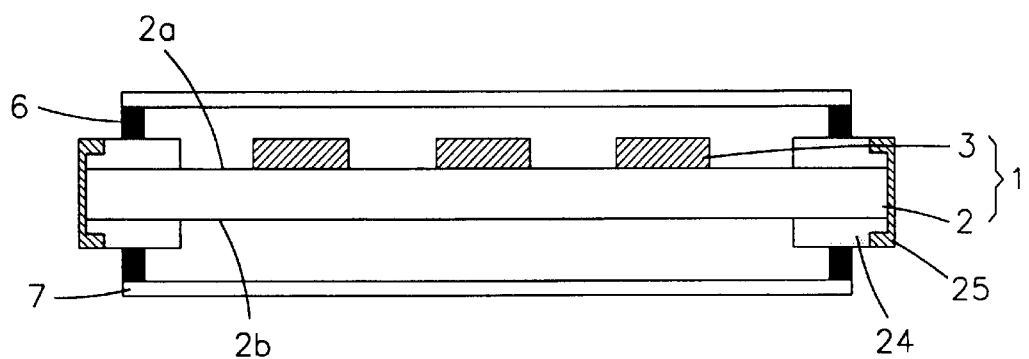
FIG. 7 is a vertical cross-sectional view illustrating an example of the mask for recycling in FIG. 4 taken along the line VI–VI'.

FIG. 6 is a plane diagram illustrating an example of a mask for recycling according to a second embodiment of the present invention, and FIG. 7 is a vertical cross-sectional view illustrating an example of the mask for recycling of FIG. 4 taken along the line VI–VI'. This example of the mask for recycling according to the second embodiment of the present invention has a same construction as the exemplary mask of the first embodiment, except for the changes to the mask frame and the mask frame holder and the exclusion of holes.

Specifically, the mask frame and the mask frame holder according to the second embodiment of the present invention will be described in detail.

Figure 8A:
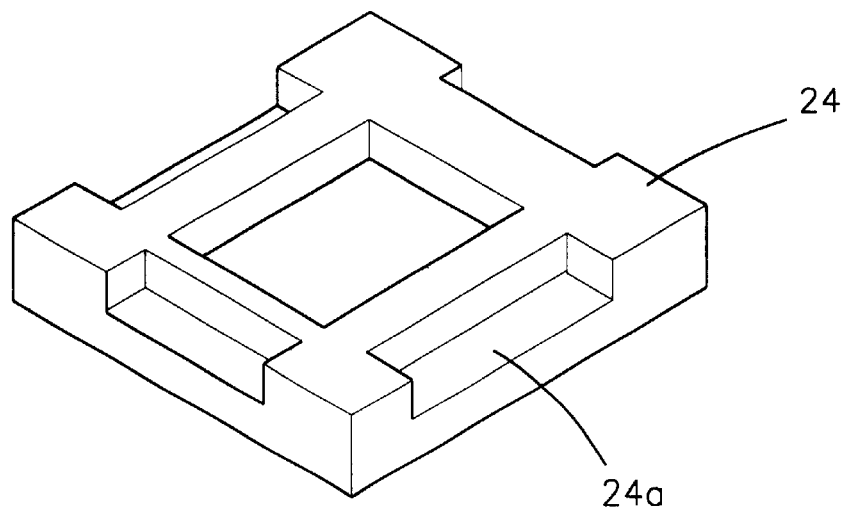
FIG. 8A illustrates a mask frame applied to the mask for recycling according to the second embodiment of the present invention.
Figure 8B:
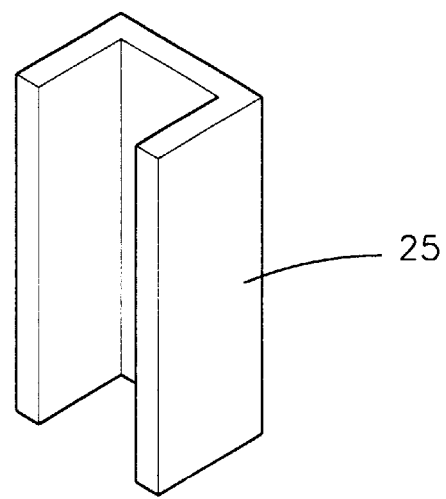
FIG. 8B illustrates a mask frame holder applied to the mask for recycling according to the second embodiment of the present invention.

FIG. 8A illustrates a mask frame 24 according to the second embodiment of the present invention. Here, the mask frame 24 has a groove 24a hollowed on an outer edge portion thereof so that the groove 24a is formed lower than an inner portion facing a plurality of light proof patterns 3. The mask frame 24 is attached to each portion of upper and lower surfaces of the thin film 1, and the mask frames 24 and the thin film 1 are fixed by inserting a ⊏-shaped clamp 25 (hereinafter, called the mask frame holder, as shown in FIG. 8B and identified by reference numeral 25) in the groove 24a of the edge portion of each mask frame 24.

The method for fabricating the recyclable mask according to the second embodiment of the present invention is the same as the method for fabricating the mask according to the first embodiment, except that the clamp is used as the mask frame holder for fixing the mask frames and the thin film, not the screw. Thus, the mask shown in FIG. 5 could be accommodated by the clamps of the second embodiment.

When fabricating the recyclable mask according to either method as described above, the mask may simply be recycled by performing steps of separating the mask frame holders from the mask frames; removing the thin film placed between the mask frames; inserting a new thin film between the mask frames; and fixing the mask frames and the thin film with the mask frame holders.

In either of the above embodiments, the pellicle frame 6 and mask frame 14 can be integrated such that the pellicle 7 is attached directly to the mask frame 14. Such a design eliminates extra components, reducing cost and manufacturing difficulty, and reduces unit size.

Furthermore, the mask frames can be solid or otherwise constructed, and the thin film can be designed to filter any incident particle, including light, electrons or radiation of other sorts. Still further, although the drawings show the mask frames positioned at edge portions of the thin film, they may be positioned at any peripheral portion of that thin film.

FIG. 9 illustrates a method for recycling a mask according to the present invention. In step 91, the mask frame holder (S) is released to enable independent movement between the mask frames and the thin film. Once the frame holder has been released, the mask frames are separated from the thin film (step 92) and the thin film is removed (step 93). A new thin film is then inserted between the mask frames (step 94), the mask frames are positioned to contact the new thin film (step 95), the mask frames are attached to the new thin film (step 96), and the frame holder (S) fixes the mask frames with respect to the new thin film (step 97). In this process, the pellicle frame and/or pellicle remain attached to respective mask frame members.

As described above, the mask for recycling according to the present invention, which disconnects the mask frames by loosening the mask frame holders, effectively reduces manufacturing cost of the semiconductor device by permanently using the mask unless it is physically damaged, and prevents environmental pollution due to the reduction of waste.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A mask, comprising:
   a thin film filtering light according to a predetermined-shaped pattern;
   a pair of mask frames positioned at peripheral upper and lower surfaces of the thin film, each mask frame having an opening in a center part thereof;
   at least one removable mask frame holder fixing the mask frames to the thin film; and a pellicle positioned on at least one side of the thin film and attached to at least one of top and bottom surfaces of the mask frames.

2. The mask of claim 1, wherein each of the mask frames has a plurality of holes.

3. The mask of claim 2, wherein the mask frame holder includes a screw that penetrates a hole of one of the mask frames.

4. The mask of claim 1, wherein each of the mask frames has a groove on an edge portion thereof.

5. The mask of claim 1, wherein the mask frame holder is a clamp.

6. The mask of claim 1, wherein the thin film comprises:
an optically transparent substrate; and
at least one non-transparent pattern positioned on the substrate.

7. The mask of claim 1, wherein the thin film comprises a non-transparent substrate having openings that are transparent.

8. The mask of claim 1, further comprising:
a pellicle frame that is positioned between and attached to each of at least one of the top and bottom surfaces of the mask frames and the pellicle attached thereto.

9. The mask of claim 1, comprising more than one mask frame holder.

10. A fabrication method for a mask, comprising:
attaching mask frames on a peripheral portion of upper and lower surfaces of a thin film designed to filter light according to a predetermined shape pattern;
removably fixing the mask frames to the thin film using at least one mask frame holder; and
fixing a pellicle with respect to at least one of top and bottom surfaces of the mask frames.

11. The method of claim 10, further comprising fabricating the thin film, including:
applying a non-transparent layer on a substrate which is optically transparent;
forming a resist pattern on the non-transparent layer;
selectively etching and opening the non-transparent layer using the resist pattern as a mask; and
removing the resist pattern.

12. The method of claim 10 further comprising fabricating the thin film, including:
forming a resist pattern on a non-transparent substrate for blocking light; and
selectively etching and opening the non-transparent substrate using the resist pattern as a mask.

13. The method of claim 12, wherein the fabrication step further comprises depositing an optically transparent substance in an open portion of the non-transparent substrate resulting from the etching process.

14. The method of claim 10, further comprising:
attaching a pellicle frame on a portion of at least one of upper and lower surfaces of the mask frame, and
attaching the pellicle to at least one of top and bottom surfaces of the pellicle frame, the pellicle frame being positioned between the mask frame and the pellicle.

15. The mask of claim 4, wherein the mask frame holder is a clamp that engages said groove.

16. The method of claim 10, wherein said removably fixing step removably fixes said mask frames to the thin film using at least one screw.

17. The method of claim 10, wherein said removably fixing step removably fixes said mask frames to the thin film using at least one clamp.

* * * * *